United States Patent [19]

Evans

[11] Patent Number: 4,950,365

[45] Date of Patent: Aug. 21, 1990

[54] CORROSION FREE HARD COATED METAL SUBSTRATES

[75] Inventor: Joseph D. Evans, Lafayette, Colo.

[73] Assignee: Vac-Tec Systems, Inc., Boulder, Colo.

[21] Appl. No.: 288,571

[22] Filed: Dec. 22, 1988

[51] Int. Cl.$^5$ .......................... C25D 5/48; C23C 14/34
[52] U.S. Cl. ............................... 204/38.7; 204/192.16; 204/192.31; 204/192.38
[58] Field of Search ................. 204/38.1, 38.7, 192.16, 204/192.31, 192.38

[56] References Cited

U.S. PATENT DOCUMENTS

| | | | |
|---|---|---|---|
| 3,573,968 | 4/1971 | Loeb | 111/106 |
| 3,600,216 | 8/1971 | Stewart | 117/72 |
| 3,716,348 | 2/1973 | Perkins | 204/38.7 |
| 4,176,209 | 11/1979 | Baker | 427/248 B |
| 4,225,647 | 9/1980 | Parent | 428/336 |
| 4,237,184 | 12/1980 | Gonseth | 428/336 |
| 4,390,567 | 6/1983 | Liepins | 427/214 |
| 4,436,775 | 3/1984 | Graham | 427/419.7 |
| 4,463,033 | 7/1984 | Kikuchi | 427/255.3 |
| 4,610,896 | 9/1986 | Veltri | 427/140 |
| 4,758,451 | 7/1988 | Vandenberg | 427/249 |

Primary Examiner—T. M. Tufariello
Attorney, Agent, or Firm—Beaton & Swanson

[57] ABSTRACT

A process for making an article comprising a substrate, a first coating on the surface of said substrate of a thin, hard coated metal compound, and a second coating on the surface of said first coat of a thin uniform conformal polymeric material.

17 Claims, No Drawings

CORROSION FREE HARD COATED METAL SUBSTRATES

FIELD OF THE INVENTION

This invention relates to the hard coating of metal substrates to form a hard, thin, wear-resistant, decorative and corrosion free surface.

BACKGROUND OF THE INVENTION

There are several means known in the prior art for the hard coating of metal substrates with thin, decorative and wear-resistant coatings. Such coatings include titanium nitride, titanium carbide, titanium carbonitride, zirconium nitride, zirconium carbide, and zirconium carbonitride. Such hard coating techniques include evaporative vacuum deposition, electroplating, magnetron sputtering, ion plating, and thermal or plasma spray techniques.

Substrates to be hard coated, particularly for use as tools or instruments, are often made of steel. The coating, for example, of a high speed steel drill bit with a thin coating of titanium nitride can be accomplished so that the drill bit has a decorative golden finish that provides excellent wear characteristics.

The steel substrate typically used for tools or instruments that will be hard coated generally has a "rough" surface. Although the surface of the substrate will appear smooth upon visual inspection, the surface is pitted and rough on a microscopic level. In addition to the surface "roughness", the substrate surface contains various small deposits of oxides from the manufacturing process. These surface irregularities are not removed in the manufacturing process. Although chemical cleaning by reverse plating or acid etch is possible to remove these deposits, such a process would be costly and environmentally troublesome. The first stage of any hard coating process is the "cleaning" of the substrate surface in order to allow for the application of a conformal coating.

Effective and efficient applications of hard coated metal surfaces dictate that extremely thin layers of the metal compound be applied to the substrate surface. It is possible to coat such substrates with surfaces of less than two or three microns in thickness. Notwithstanding the pitted nature of the steel substrate, the existence of various surface deposits of oxides, the thinness of the applied coating and the characteristics of the metal compounds being applied, it is generally possible to place a hard coating on the substrate that is essentially free of fissures or pores.

These various factors do combine, however, to create a variety of coating defects. One example of a coating defect is the existence of a nodule. Nodules are cone-shaped particle formations in the surface of the coating. Nodule boundaries have increased permeability properties. Another example of a common surface defect is referred to as "bridging". Small amounts of free iron on the surface of the substrate, along with some adsorbed oxygen, resist coating and create bridges or areas of relatively thin coating. These areas of thin coating also have increased permeability properties.

The existence of these and other types of defects in the hard coated metal compound is not detectable by visual inspection, and does not in any way affect the wear-resistant characteristics of the coating. The existence of coating defects does lead to surface phenomena that eventually tend to the formation of corrosion on the surface of the substrate.

Corrosion can occur in two ways. The simple oxidation of iron leads to rust formation very rapidly. Corrosion can also result from the formation of "galvanic cells" between the coating and the substrate. Galvanic cells are created at the point of conductive contact between two dissimilar metals. Galvanic cells are created between the coating and substrate at defect sites due, in part, to the migration of iron through the coating and the presence of air and moisture migrating through the coating to these sites. No amount of surface preparation or cleaning prior to the coating process has been found that will prevent the formation of galvanic cells—and therefore corrosion—at the surface/coating interface. Such corrosion leads rapidly to large areas of the hard coated article becoming blotched and darkened. Although the wear-resistant characteristics of the hard coated metal compound article are not affected, the decorative surface is marred.

Parylene is a uniform conformal polymeric coating material that is used primarily in the electronics industry. One of its most important properties is its ability to form an extremely thin layer onto the surface of substrates and to conform uniformly—over sharp edges, points, flat surfaces, crevices or exposed internal surfaces—to the surface of the coated substrate. Parylene is also valuable for its ability to resist many chemicals and relatively high temperatures.

Parylene is a generic term applied to the family of unsubstituted and substituted poly-p-xylylenes. The specific parylene polymer formed can be either a homopolymer or a copolymer, depending on the particular building blocks used to create the polymer. The parylene polymer is generally produced from one or a mixture of para-xylylene dimer compounds. The unsubstituted homopolymer poly-p-xylylene has the structure

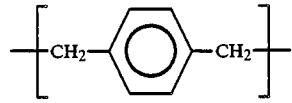

which is referred to by its trademark name of PARYLENE N. Other parylenes which can be produced from commercially available dimers are as follows:

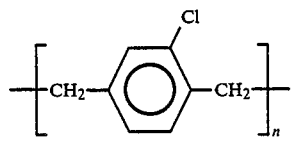
PARYLENE C

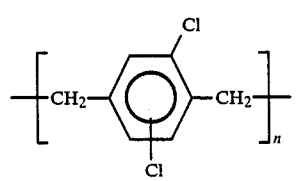
PARYLENE D

Of course, an almost unlimited number of substituted co- and homopolymers have been suggested in the prior art.

A description of parylenes, the processes for making them, and the apparatus in which parylene vacuum deposition can be effected may be found in U.S. Pat.

Nos. 3,246,627 and 3,301,707 of Loeb, et al. and U.S. Pat. No. 3,600,216 of Stewart, all of which are incorporated by reference herein. These patents do not utilize the term "parylene", but instead refer to poly-p-xylylenes.

The typical process for coating any given substrate with a thin layer of parylene involves the vacuum vapor deposition of the biradical monomer units that are produced by pyrolysis of dimeric para-xylylene units as follows:

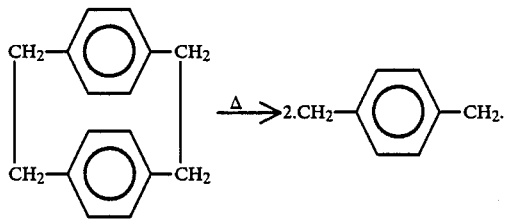

The biradical monomers formed are then introduced into a deposition zone where they rapidly polymerize on the surface of an ambient temperature substrate.

By appropriate control of reaction conditions, the desired thickness of parylene coating may be obtained. The polymeric coating formed is almost exclusively linear, i.e., without any cross-linking between the linear polymeric chains. In some instances, the substrate surface is first treated with a silicone-based compound in order to enhance the binding of the parylene to the substrate. See U.S. Pat. Nos. 3,600,216 of Stewart and U.S. Pat. No. 4,225,647 of Parent.

The ability of parylene to form a conformal coating is so efficient that the application of a layer of parylene creates a barrier from the environment to the substrate. The ability to form an environmental barrier is a well known property of parylene that finds many uses, particularly in the electronics industry.

Unfortunately, despite the varied desirable qualities of a parylene coating, the thin parylene coating is quite soft and is easily worn off of any substrate that is subject to wear or moderate physical handling. Because of this, all commercial applications for parylene, to date, are limited to the protection of substrates that are not subject to any significant physical wear.

Therefore, even though hard coated metal substrates and parylene coated substrates both have many significant applications, neither can be used satisfactorily when a hard, thin, wear-resistant, decorative and corrosion free surface is required on metal substrates that are subject to even moderate amounts of physical wear. The soft surface provided by a parylene coating is a well known liability of such a coating. For this reason and others it is not obvious to apply a soft parylene coating over a hard wear-resistant coating.

SUMMARY OF THE INVENTION

This invention relates to a method for coating substrates that receive some physical wear so that the substrate is wear-resistant, decorative and corrosion free even after substantial use, and to substrates with these desirable characteristics.

According to the present invention, articles such as steel tools or instruments may be produced which have these previously unobtainable features. The first step of the two step process of this invention requires the coating of a metal substrate with a thin, hard coated layer of a metal compound. Examples of such metal compounds are: titanium nitride, titanium carbide, titanium carbonitride, zirconium nitride, zirconium carbide and zirconium carbonitride.

The second step of this invention requires the addition of a second layer of coating on the surface of the first coating. The second coating consists of a uniform conformal polymeric material. Parylene is an example of such a coating material.

The articles of the present invention have the heretofore unknown combination of desirable properties. Even following extensive use of an article—for example, a screwdriver blade coated as described herein—the article retains its hard, wear-resistant surface, its decorative tone and its resistance to corrosion. The outer parylene layer is almost immediately worn off of the surface of the substrate, exposing the hard coated metal surface. However, the conformal quality of the parylene coating is so efficient that the areas of increased permeability associated with the coating defects—which invariably exist in the hard coated layer—are "filled" with the polymeric coating. Even after extensive use of the article, the parylene unexpectedly prevents air and moisture from reaching the surface of the article. It is therefore possible to combine the desirable properties of the two coatings even after, by all appearances, the soft parylene coating has long been worn off the surface of the article.

DESCRIPTION OF THE PREFERRED EMBODIMENT

It is becoming more and more desirable, although not essential, that tools and instruments have a decorative appearance. Increasingly, large retailers of such items require that standard wear and strength requirements be coupled with a glossy, golden surface. With the advent and refinement of several hard coating techniques, it is possible to apply extremely thin, hard and wear-resistant surfaces that can be made with an attractive glossy surface that looks like gold or almost any other color desired.

The articles to be coated according to this invention are generally made of a low grade steel that is of just a high enough quality to meet appropriate strength requirements. Substrates which are envisioned within the scope of this invention include, but are not limited to, screwdriver blades, drill bits, saw blades, wrenches, pliers, socket sets, screws, hammer heads, hinges, nut drivers, shears and the like.

Hard coated metal compound surfaces can be produced by several different application techniques. Among these are: vacuum evaporation processes; electroplating; thermal or plasma spray; magnetron sputtering, as described for example in U.S. Pat. Nos. 4,162,954 and 4,180,450 of Morrison; ion plating; and cathodic arc plasma deposition (CAPD).

In a preferred embodiment of the invention, the hard coated surface is applied by CAPD technology. CAPD technology is a form of ion plating that provides large area arc sources that assure exceptional film uniformity over small, large and complex substrates, and also provides shorter cycle times and high throughput. In the CAPD process, target material is evaporated by the action of vacuum arcs. The target source material is the cathode in the arc circuit. The basic components of a CAPD system consist of a vacuum chamber, a cathode and an arc power supply, means for igniting an arc on the cathode surface, an anode, a substrate and a substrate bias power supply. Arcs are sustained by voltages typically in the range of 15-50 V, depending on the target cathodic material employed. Typical arc currents are in the range of 30-400 A. Arcing is initiated by the application of a high voltage pulse to an electrode placed near the cathode (gas discharge ignition) and/or by mechanical ignition. The evaporation occurs as a result of cathodic arc spots which move randomly on the surface of the cathode at speeds typically on the order of $10^2$ m/s. The arc spot motion can also be controlled with the help of appropriate confinement boundaries and/or magnetic fields. The arc spots are sustained by the material plasma generated with the arc.

The basic CAPD process has evolved over the past twenty years. U.S. Pat. Nos. 3,625,848 and 3,836,451 of Snaper, assigned to Vac-Tec Systems, Inc., provide the origins of the basic process. U.S. Pat. No. 4,430,184 of Mularie and U.S. Pat. No. 4,724,058 of Morrison, Jr. (also both assigned to Vac-Tec Systems, Inc.) teach improvements to the CAPD process. A summary of the CAPD art is provided in "Cathodic Arc Deposition Technology" by H. Randhawa, 167 *Thin Solid Films,* pp. 175-85 (1988). These references are each incorporated herein by this reference.

Utilizing CAPD technology, the substrate to be coated according to this invention is placed within a CAPD apparatus for application of a hard coated metal compound surface. The pressure in the CAPD apparatus is typically reduced to $1 \times 10^{-5}$ Torr in order to remove most of the air and moisture from the system. Nitrogen is then introduced into the apparatus, raising the pressure to approximately $1 \times 10^{-3}$ Torr. The CAPD process consists of a cleaning cycle and a deposition cycle. The "cleaning" cycle involves the bombardment of the substrate with ions. The deposition cycle occurs when additional nitrogen has been introduced into the CAPD apparatus to obtain an operating pressure between 4 and $20 \times 10^{-3}$ Torr.

The hard coated metal compound surface applied to the substrate according to the present invention will have a thickness between one and ten microns, and preferably between two and five microns.

The hard coated metal compound surface can be composed of any of a number of metal compounds that may be applied via conventional techniques and that may be applied in a thin layer to form a hard, wear-resistant and decorative coating on a substrate. Examples of such coatings are nitrides, carbides or carbonitrides of the refractory metals, such as titanium, zirconium, hafnium, tungsten and niobium. The hard coated metal compound surface may be composed of titanium carbide, titanium nitride, titanium carbonitride, zirconium carbide, zirconium nitride or zirconium carbonitride. In the most preferred embodiment of the invention, the hard coated metal compound surface consists of a layer of between two and five microns of zirconium nitride or zirconium carbide that has been applied by CAPD technology.

This invention relates to the method of treating a substrate to form a hard, thin, wear-resistant, decorative and corrosion free coating that will withstand wear. The method comprises applying a hard coated metal compound surface as described above, followed by the application of an additional layer of a uniform conformal polymeric material. This invention is not limited to the use of parylene compounds, but extends to the use of any polymeric coating material that can be applied to conformally adhere to a substrate with a hard coated metal compound surface and provide corrosion resistance even after the polymeric coating has been worn off of the surface of said substrate.

In a preferred embodiment of the invention, the second step of the overall coating process requires the application of a thin coat of parylene onto the substrate previously treated to have a hard coated metal compound surface.

As described above, parylene is a generic name meant to refer to an entire family of chemical compounds that have the following chemical structure:

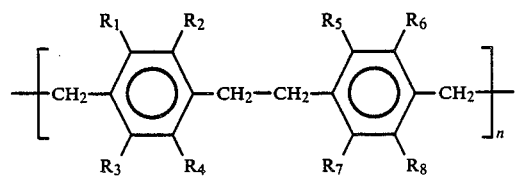

The unsubstituted parylene structure—where $R_1$-$R_8$ =H—is referred to by Union Carbide Corporation as PARYLENE N, PARYLENE C—where $R_2$=$R_6$=Cl—and PARYLENE D—where $R_2$=$R_6$=Cl and $R_3$,$R_4$=H,Cl and $R_7$,$R_8$=H,Cl—are also readily prepared from commercially available starting materials.

Substituents $R_1$-$R_8$ can be any organic or inorganic groups which can normally be substituted on aromatic nuclei. Examples of organic substituents are allyl, aryl, alkenyl, cyano, carboxyl, alkoxy, hydroxy allenyl, and carbalkoxy; and examples of inorganic substituents are hydroxyl, nitro, halogen and amino. Generally, the functional groups are inert under process conditions. Of the various possible constituents, the preferred groups are the lower alkyls having one to ten carbon atoms, such as methyl, ethyl, propyl, butyl and hexyl; the lower aryl hydrocarbons having one to two benzene rings such as phenyl or napthyl and the alkylated phenyls and napthyls having one to ten carbon atoms in the alkyl moiety; and the halogens—chlorine, bromine, iodine and fluorine. Due to problems of steric hindrance, it would be most preferred that at least two positions on each of the aromatic rings, $R_1$-$R_4$ and $R_5$-$R_8$, be unsubstituted.

The deposition of parylene coatings is accomplished according to procedures well known in the art. The appropriate starting material is a dimer of the following general structure:

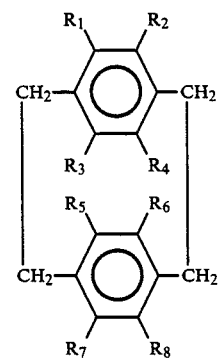

The deposition process occurs so that the relatively high temperatures required to pyrolize the dimer are isolated from the substrates to be coated. The dimer generally exists as a powder that is vaporized in one chamber, pyrolized in a second chamber, and the biradicals formed are then introduced into the deposition chamber which is maintained at ambient temperatures. The biradicals formed

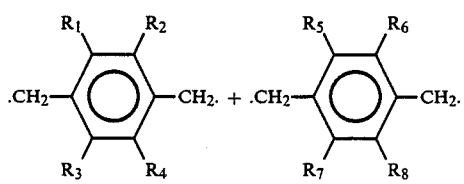

rapidly condense, or polymerize, to form a uniform conformal coating on the surface of the substrate. In a single batch application, parylene coatings can be applied from 0.10 to 75 microns. In the preferred embodiment of this invention, the parylene coating is applied to a depth of 2-3 microns.

In the most preferred embodiment of the present invention, a steel substrate (such as a tool or instrument) that will be subject to at least moderate amounts of physical wear is first coated with a thin layer of 2-5 microns of zirconium nitride in a CAPD apparatus. The substrate has a golden colored surface following this step. The substrate is then coated with a thin layer of 2-3 microns of PARYLENE C in a standard parylene deposition apparatus.

During the routine course of inspecting and packaging the substrate after the application of the parylene coating, the physical handling involved will have worn at least a portion of the parylene off of the exterior surface of the substrate; nonetheless, the combined properties of the two step coating process are still effective.

EXAMPLE

A. A screwdriver blade made of a low grade steel was utilized as a substrate. Substrates were vapor degreased and chemically cleaned prior to initiation of the CAPD coating process.

The tool was coated in CAPD apparatus as described in U.S. Pat. No. 4,430,184 of Mularie and U.S. Pat. No. 4,724,058 of Morrison, Jr. with a 2 micron layer of zirconium nitride.

B. The tool of Part A was coated in a parylene deposition apparatus as sold by the Nova Tran Corporation and as generally described in U.S. Pat. No. 3,472,795 of Tittman et al. with a 2.5 micron layer of PARYLENE C. The powdered starting material was a dimer of the following structure:

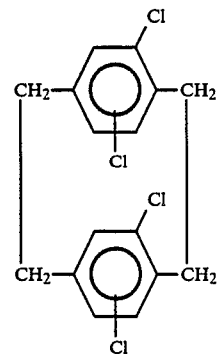

The tools coated in Part A and Part B, as well as a tool prior to any coating, were placed in a salt spray corrosion testing atmosphere—ASTM standard test B118—with the following results:

|  | Time | | |
| --- | --- | --- | --- |
|  | 1 hr | 8 hr | 400 hrs |
| uncoated tool | corrosion | — | — |
| Part A | — | corrosion | — |
| Part B | — | — | — |

The result obtained for the tool prepared according to Part B was the same whether or not the parylene coating was removed from the exterior surface of the tool due to normal handling and shipping.

The embodiments presented here are provided for the purposes of illustration and are not intended in any way to limit the breadth of the claims as set forth below.

What is claimed is:

1. A process for coating carbon steel substrates comprising:
   (a) applying onto the surface of said substrate a first coat of a thin hard coated layer of a metal compound selected from the group consisting of titanium nitride, titanium carbide, titanium carbonitride, zirconium nitride, zirconium carbide and zirconium carbonitride; and
   (b) applying onto the surface of said first coat a second coat of parylene.

2. A process as in claim 1 in which said substrate is a tool or instrument that is subject to at least moderate amounts of physical wear.

3. A process as in claim 1 in which said first coat is between 1 and 10 microns thick.

4. A process as in claim 1 in which said first coat is between 2 and 5 microns thick.

5. A process as in claim 1 in which said first coat is applied by ion plating.

6. A process as in claim 1 in which said first coat is applied by cathodic plasm arc deposition.

7. A process as in claim 1 in which said first coat is applied by sputtering.

8. A process as in claim 1 in which said first coat is applied by evaporative vapor deposition.

9. A process as in claim 1 in which said first coat is applied by electroplating.

10. A process as in claim 1 in which said first coat is applied by spray techniques.

11. A process as in claim 1 in which said second coat is between 1 and 10 microns thick.

12. A process as in claim 1 in which said second coat is between 2 and 3 microns thick.

13. A process as in claim 1 in which said parylene has the structure:

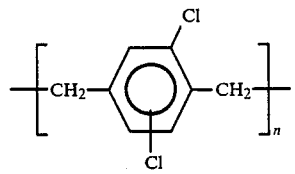

14. A process as in claim 1 further comprising substantially removing said second coating from the exterior surface of said first coating.

15. A process for coating carbon steel tool or instrument substrates that are subject to at least moderate amounts of physical wear comprising:

(a) applying onto the surface of said substrate a first coat of 2-5 microns of titanium nitride or zirconium nitride by cathodic plasma arc deposition; and (b) applying onto the surface of said first coat a second coat of 2-3 microns of parylene.

16. A process as in claim 15 in which said parylene has the structure:

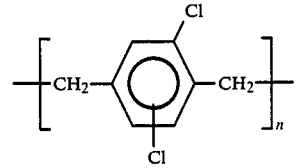

17. A process as in claim 15 further comprising substantially removing said second coating from the exterior surface of said first coating.

* * * * *